United States Patent [19]
Ichikawa

[11] Patent Number: 4,599,272
[45] Date of Patent: Jul. 8, 1986

[54] ANTI-REFLECTION COATING FOR OPTICAL COMPONENT AND METHOD FOR FORMING THE SAME

[75] Inventor: Hajime Ichikawa, Tokyo, Japan

[73] Assignee: Olympus Optical Company Limited, Tokyo, Japan

[21] Appl. No.: 648,729

[22] Filed: Sep. 7, 1984

[30] Foreign Application Priority Data

Sep. 20, 1983 [JP] Japan ................... 58-173848

[51] Int. Cl.⁴ ............................................. B32B 27/36
[52] U.S. Cl. .................. 428/412; 204/192 E; 350/164; 350/165; 351/166; 427/38; 427/164; 427/167; 427/255; 427/255.2; 427/255.7; 427/419.1; 427/419.2; 428/428; 428/446; 428/448; 428/451
[58] Field of Search ............. 427/35, 38, 162, 164, 427/166, 167, 419.3, 419.2, 402, 255, 419.1, 255.2, 255.7, 255.3; 350/164, 165; 351/166; 428/412, 428, 446, 448, 913, 500, 451, 521; 204/192 E; 156/643

[56] References Cited

U.S. PATENT DOCUMENTS

| | | | |
|---|---|---|---|
| 2,490,263 | 12/1949 | Gaiser et al. | 427/167 |
| 2,641,954 | 6/1953 | Scharf et al. | 427/167 |
| 3,356,522 | 12/1967 | Libbert | 350/164 |
| 3,356,523 | 12/1967 | Libbert | 350/164 |
| 3,804,491 | 4/1974 | Morokuma et al. | 427/166 |
| 3,958,042 | 5/1976 | Katsube et al. | 427/164 |
| 3,984,581 | 10/1976 | Dobler et al. | 427/167 |
| 4,168,113 | 9/1979 | Chang et al. | 350/165 |
| 4,310,614 | 1/1982 | Connell et al. | 427/38 |

*Primary Examiner*—Sadie L. Childs
*Attorney, Agent, or Firm*—Robert E. Burns; Emmanuel J. Lobato; Bruce L. Adams

[57] ABSTRACT

An anti-reflection coating for an optical component and a method of forming the same are disclosed. The anti-reflection coating is formed on a substrate for an optical component by subjecting a mixture of an evaporating material and 10-30% of $SiO_2$ to vacuum evaporation at room temperature without heating the substrate. When the anti-reflection coating is a single layer, a mixture of $MgF_2$ and 10-30% of $SiO_2$ is used as the evaporating material. When the anit-reflection coating is a multi-layer structure, a mixture of a fluoride or a silicon oxide and 10-30% of $SiO_2$ for a first layer, and a mixture of a fluoride or an oxide and 10-30% of $SiO_2$ for middle and last layers are used as the evaporating material.

14 Claims, 27 Drawing Figures

ANTI-REFLECTION COATING FOR OPTICAL COMPONENT AND METHOD FOR FORMING THE SAME

BACKGROUND OF THE INVENTION

1. Field of the Invention

This invention relates to an anti-reflection coating for optical components and a method of forming the same, and is characterized by forming an anti-reflection coating on an optical component at room temperature by vacuum evaporation without heating.

2. Description of the Prior Art

Heretofore, in case of forming an anti-reflection coating on an optical component, a method has usually been produced wherein an evaporating material for the formation of the anti-reflection coating is deposited on the optical component by heating at 250°–400° C. under vacuum, or the so-called hot coat method. In the hot coat method, however, the application range of vacuum evaporation, productivity, and stability of properties are very narrow and low at present as will be mentioned later.

For instance, when an inorganic glass substrate is used as the optical component, there are the following drawbacks (1)–(6):

(1) Since a metal fluoride, metal oxide or the like is used as the evaporation material, an undesirable oxidation reaction is caused on the heated glass substrate by the hot coat method, or the resulting deposit coating is reoxidized when being exposed to the atmosphere at an incompletely cooled state. As a result, the change of refractive index is revealed as a change of spectral reflectance with the lapse of time.

(2) In case of a high refracting glass substrate containing lead or the like, the metallic element such as Pb or the like is apt to be separated on the substrate surface by heating. As a result, the spectral reflecting characteristics of the Pb separated layer are obtained in addition to the spectral reflecting characteristics of the deposition coating, so that the anticipated spectral reflectance of the coating cannot be obtained.

(3) When a glass having a considerably high linear expansion coefficient such as FK-01 or the like is used as the substrate, it is necessary that the heating temperature during the evaporation be set at a value lower than the usual one or the slow cooling time after the heating is prolonged so as to prevent the cracking of the glass itself.

(4) In vacuum evaporation, the glass substrate is usually arranged on a metal fitting and placed in a dome of an evaporation apparatus. When the hot coat method is carried out at a temperature of about 300° C. and then cooling is performed, a difference in shrinkage between the glass and the metal fitting results in accordance with the difference of linear expansion coefficient therebetween. Consequently, when the size of the clearance between the glass substrate and the metal fitting is very small, the metal fitting invades the glass substrate to cause breaking of glass.

(5) In the vacuum evaporation apparatus used in the hot coat method, the temperature is raised by heating from the time of rough evacuation, so that gas generates in the chamber and a very long evacuation time is required. Further, since a slow cooling is required after the evaporation, the total evacuation time becomes very long.

(6) Considering the structural design on the driving, transferring and rotating of the evaporation apparatus as well as the chamber in itself, troubles such as deformation and the like may be caused by the heating (about 300° C.) in the vacuum seal, lubricating system and bearings. For instance, when the bearing is used in the driving part, it is apt to cause baking and a long-period of durability is not satisfied. Therefore, a cooling portion is arranged in the driving part, or the bearing may be made from a special material or subjected to a special treatment, so that the cost of parts used becomes very expensive. As the vacuum seal (packing) material is used having a high heat resistance, which also results in the increase of the cost. Further, if it is intended to use an apparatus of a complicated mechanism having a transferring system and a rotation system, it is necessary to arrange cooling portions in these systems as a countermeasure for the heating, and consequently the amount of water used in these cooling portions affects the cost. And also, it is necessary to use a special and thick material capable of reducing the releasing gas without causing material deformation, which results in an increase of the cost.

Next, when a synthetic resin substrate is used as an optical component in the hot coat method, drawbacks result as follows.

The transparent synthetic resin for optical use includes acrylic resin based diethylene glycol bisallyl carbonate or polycarbonate (hereinafter abbreviated as PC), acrylic resin, acrylonitrile-styrene copolymer (hereinafter abbreviated as AS), polystyrene (hereinafter abbreviated as PS) and the like. The optical components are cheaply manufactured from these resins by casting, injection molding or the like, so that they are light as compared with the inorganic glass components and can freely be made into an optional shape, but are weak in heat (deformation, deterioration of material properties) and are easily injured. This weak point in heat is a fatal defect in the formation of the anti-reflection coating by the vacuum evaporation of the hot coat method. That is, in case of the inorganic glass substrate, a coating of metal fluoride or metal oxide having high adhesion and hardness can easily be evaporated on the substrate by heating to 250°–400° C. Moreover, in case of the synthetic resin substrate, heating above 80° C. deforms the substrate or changes the refractive index thereof, so that it is very difficult to form an anti-reflection coating having high adhesion and hardness by vacuum evaporation under heating at 250°–400° C.

In order to form the anti-reflection coating on a synthetic resin optical component, therefore, various methods have been attempted, as will be mentioned later, instead of the hot coat method. However, these methods take a serious view of the coating material, coating formation, coating properties (optical characteristics, durability) different from the case of forming an anti-reflection coating on inorganic glass, so that they have various drawbacks as mentioned below.

(a) The first method is a method of depositing SiO$_2$ or evaporation glass as an undercoat layer on the surface of the synthetic resin optical component at a thickness of 0.5–10μ and then forming an anti-reflection coating thereon. In this method, however, the deposition of SiO$_2$ or evaporation glass takes a long time, so that the workability and productivity are poor. Further, when the thickness of the layer of SiO$_2$ is 0.5–10μ, the absorption of light is increased and a 0.1–0.3% ripple reflection waveform is exhibited. And also, since the strength of the undercoat layer is great, stress deformation is caused in accordance with the thickness of the undercoat layer, whereby the accuracy of the shape of the synthetic resin optical component can not be retained satisfactorily.

(b) The second method is a method wherein a polytrialkoxy silane is applied to the surface of the synthetic resin optical component to form a hardened coating or further an inorganic oxide coating of SiO, SiO$_2$, Al$_2$O$_3$ or the like is formed thereon by vacuum evaporation. In this method, however, it is very difficult to apply the polysiloxane paint to the optical component having an optional shape at an accuracy of uniform thickness. Further, the cost of equipment (production) for forming the strong hardened coating in a short time is expensive.

Up to now, when the above method is applied to a plate-like optical component, the thickness of the hardened coating formed in a short time is limited to about 1μ in order to retain the high accuracy of such thickness without changing the accuracy of the component shape. On the other hand, in case of the synthetic resin optical components having an optional shape, it is almost impossible, when the polysiloxane paint is applied to the surface of the optical component at a thickness of 0.1–0.3μ as a whole, to obtain a strong hardened coating in a short time without changing the accuracy of the component shape.

(c) The third method is an evaporation of SiO on the synthetic resin optical component. SiO can be evaporated by resistance heating, and has good adhesion to the optical component as compared with SiO$_2$, and can optionally change the refractive index by the enclosing of O$_2$, and can impart optical characteristics as a multilayer coating. However, it is difficult to control the evaporation rate of SiO from the beginning of evaporation to the completion thereof in proportion to the heating force during the evaporation of SiO. Furthermore, an oxidation action of SiO or a difference in the change of refractive index is produced by the size of the chamber, evacuation amount and evacuation rate in the evaporation apparatus during the changing of refractive index through O$_2$, so that it is difficult to always obtain the desired refractive index with good reproducibility.

Therefore, the evaporation of SiO is very poor in productivity (automation, mass production), which comes to the problem of considering high efficiency and yield.

(d) The fourth method is a method wherein a hard coat film consisting of an oxygen silicon nitride (SiO$_x$N$_y$) and having chemical stability and no hygroscopicity is formed on the synthetic resin optical component by a high-frequency ion plating process and then a coating having an anti-reflection effect is formed thereon. In this case, the oxygen silicon nitride film is formed by any one of the following four processes.

I. SiO$_2$ and Si$_2$N$_4$ are evaporated in the same amounts, while controlling the ratio of evaporation rates, to form an oxygen silicon nitride film having a desired refractive index;
II. SiO is evaporated by reaction with the atmosphere such as NO, ammonia or the like;
III. An evaporation source such as Si metal or SiO is subjected to reactive ion plating in a gaseous atmosphere such as Ar+NO, ammonia, N$_2$, O$_2$ or the like; and
IV. A target of Si metal is subjected to sputtering evaporation in a reactive gas atmosphere such as Ar+NO, ammonia, N$_2$, O$_2$ or the like.

In any case of the above processes, an oxygen silicon nitride film having a refractive index of 1.46–2.00 can be formed, so that when this film is adhered as a first layer on the optical component in compliance with the refractive index of the optical component, it can be said to provide a sharp and hardenable anti-reflection coating having no ripple waveform as the spectral reflectance produced by the difference of refractive index with good reproducibility. However, the synthetic resin optical component to be subjected to such a reactive high-frequency ion plating process is usually a thermosetting resin substrate such as CR-39 or the like. This thermosetting resin may be durable at a high temperature of 100° C. as compared with the injection molding resin, so that according to the fourth method, CR-39 or the like practically used in spectacle lens is previously heated to about 70° C. before the beginning of evaporation. Therefore, the following drawbacks result when a hard coat film of oxygen silicon nitride is formed at a thickness of 1–3μ and then an anti-reflection coating is formed thereon.

(i) A very long time is taken when a hard coat film with a thickness of 1–3μ is evaporated by the reactive high-frequency ion plating process;
(ii) It is very difficult to evaporate an oxygen silicon nitride film having an optional refractive index with a good reproducibility by high-frequency ion plating in an apparatus containing an active or inert gas atmosphere such as Ar, NO, ammonia, N$_2$, O$_2$ or the like;
(iii) In the formation of an oxygen silicon nitride film by reactive high-frequency ion plating, the evaporation rate cannot be made large, so that the evaporation time is too long. Further, when the distance between the evaporation source and the substrate is sufficient to avoid radiation heat from the evaporation source, the evaporation time is required to be more prolonged. However, then the substrate is exposed to a high-frequency plasma atmosphere; if the evaporation takes a long time, the surface temperature of the substrate always tends to be raised. Since the substrate is not resistant to heat, the accuracy of the shape and size of the substrate is decreased by the long-time required for evaporation and finally the shape of the substrate is deformed.
(iv) In high-frequency ion plating, the region of film formation distribution is narrow, so that mass production is very poor. Further, the apparatus used in itself is mechanically complicated, so that the operation manual is difficult and the cost is high. Particularly, since plasma discharge is utilized, it is difficult to quantify parameters and the reproducibility of the film properties is very poor.

SUMMARY OF THE INVENTION

It is, therefore, an object of the invention to solve the aforementioned drawbacks of the prior art and to provide an anti-reflection coating for an optical component and a method of forming the same by vacuum evaporation at room temperature without heating the optical component.

According to the invention, a glass substrate or a synthetic resin substrate (diethylene glycol bisallyl carbonate, acrylic resin for injection molding, PC, AS or PS resin) is subjected to a vacuum evaporation with a mixture of an evaporating material having anti-reflection characteristics (e.g., $MgF_2$ having a refractive index of 1.38 or the like) and 10–30% $SiO_2$ as a single layer coating, or with an evaporating material of fluoride or silicon oxide as a first layer coating and a mixture of an evaporating material of fluoride or oxide and 10–30% of $SiO_2$ as middle and final layer coatings, wherein the vacuum evaporation is carried out by electron beam heating at room temperature without heating the substrate while irradiating an ion beam of Ar and/or $O_2$ during the evaporation or after the substrate is subjected to a pre-sputtering with such ion beam prior to the evaporation, whereby an anti-reflection coating is formed on the substrate.

The thus formed anti-reflection coating has very good adhesion to the substrate and excellent resistance to scuffing and the weathering, and reproductively provides a low reflective interference color.

Particularly, the durability of the anti-reflection coating can be more improved by irradiating an ion beam of Ar and/or $O_2$ onto the substrate before the vacuum evaporation (pre-sputtering effect) or during the vacuum evaporation.

DESCRIPTION OF THE PREFERRED EMBODIMENTS

As the substrate for optical components in the invention, use may be made of all substrates usually used, an example of which includes glasses for optics such as BK-7 and the like, thermosetting resins providing mechanical precision for optical components such as diethylene glycol bisallyl carbonate and the like, and injection molding resins capable of providing mechanical precision for optical components such as acrylic resin, PC, AS, PS and the like.

As the evaporating material for the formation of anti-reflection coating on the substrate, use may be made of fluorides such as $CeF_3$, $NdF_3$, $LaF_3$, $PbF_3$, $Na_3AlF_6$, NaF, LiF, $MgF_2$ and the like; and oxides such as $CeO_2$, $ZrO_2$, $Ti_2O_3$, TiO, $Al_2O_3$ and the like. Further, silicon oxides inclusive of SiO may be used partly.

It has been known that a fluoride such as $MgF_2$ or the like does not form a dense coating and is apt to peel off from the substrate after vacuum evaporation at room temperature because the tensile stress is large as compared with the adhesion to the substrate. In this connection, it has been found that when silicon oxide effective for improving the hardness, viscosity and adhesion, particularly $SiO_2$ is added to the fluoride in an amount of 10–30%, an evaporated coating having a high adhesion can be obtained after vacuum evaporation at room temperature.

According to the invention, therefore, it is an essential feature that 10–30% of $SiO_2$ is added to the evaporating material in the formation of single layer or multilayer anti-reflection coating. When the amount of $SiO_2$ is less than 10%, the evaporated coating is apt to peel off from the substrate, while when the amount exceeds 30%, an anti-reflection effect cannot be obtained.

The following examples are given in illustration of the invention and are not intended as limitations thereof.

EXAMPLE 1

Figure 1:
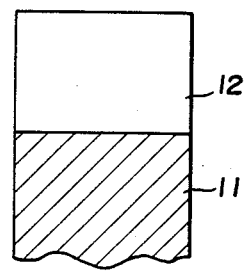
FIG. 1 is a schematically sectional view of an embodiment of the single layer anti-reflection coating formed on the substrate according to the invention.

As shown in FIG. 1, a hardenable anti-reflection coating 12 was formed on a substrate 11 for an optical component as follows.

Figure 2:
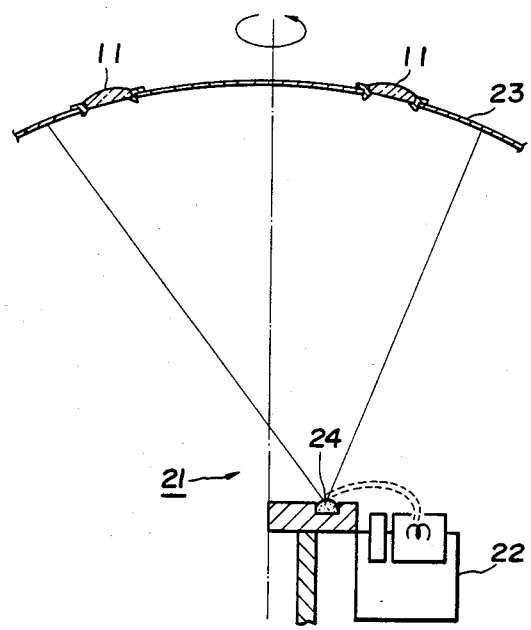
FIG. 2 is a diagrammatic view of an embodiment of the room temperature vacuum evaporation apparatus for practising the method of the invention.
Figure 3:
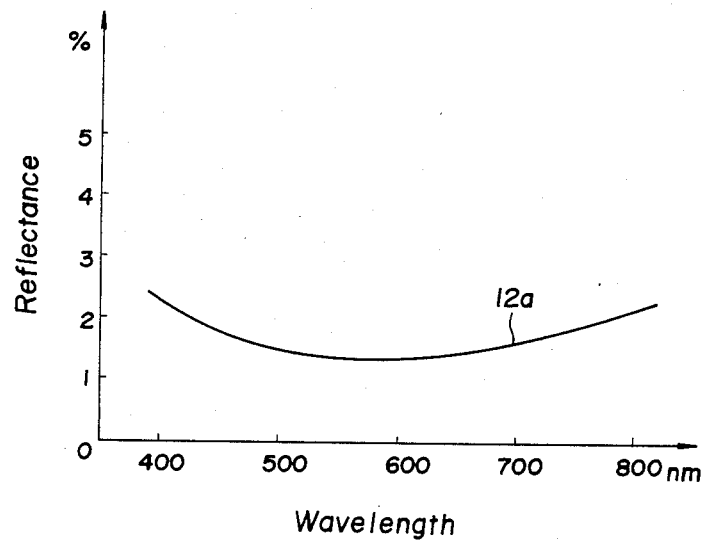
FIGS. 3 to 4 are characteristic curves of spectral reflectance of the single layer anti-reflection coating of FIG. 1 formed on various substrates, respectively.

A: BK-7 glass having a refractive index (α-ray) of 1.51633 was used as the substrate 11 and attached to a rotary dome 23 in a vacuum evaporation chamber 21 of a room temperature vacuum evaporation apparatus as shown in FIG. 2. On the other hand, a mixture obtained by adding 10–30% of $SiO_2$ to $MgF_2$ was used as an evaporating material 24 and evaporated on the substrate 11 at room temperature by means of an electron gun 22. In this case, the ultimate vacuum degree inside the chamber was $8\times10^{-6}$–$2\times10^{-6}$ Torr. The thus formed anti-reflection evaporated coating 12a had a refractive index of 1.389 and an optical layer thickness of 137.5 mμ and showed an excellent spectral reflectance as shown in FIG. 3.

Then, the test on resistance to scuffing, the test on heat-humidity resistance, the test on solvent resistance and the test for adhesion as mentioned below were made with respect to the anti-reflection evaporated coating 12a to obtain results as shown in the following Table 1.

Cleaning cloth lap test:

The surface of the substrate 11 was scrubbed with a cleaning cloth under a load of about 1 kg 20 times and then the scuffed amount was visually evaluated. The resistance to scuffing was evaluated by six stages of A-F in accordance with the degree of injury, provided that the no scuffed state is S.

Pencil hardness test:

This test was made according to a method of JIS K-5400.

Heat humidity resistance test:

The evaporated coating 12a was subjected to a repeated cycle test at a temperature of −40° C.–+80° C. or a humidity of 95% for 3 days to measure the occurrence of cracks.

Solvent resistance test:

The evaporated coating 12a was scrubbed with a cleaning cloth containing ethanol or methanol 10 times to measure the occurrence of cracks.

Adhesion test:

An adhesive-backed tape (width: 15 mm) was sufficiently bonded to the evaporated coating 12a and then instantaneously peeled off therefrom after the end of the tape was opened up to an angle of 45°, whereby the peeling of the evaporated coating 12a was visually observed for the evaluation of the adhesion.

As apparent from the results of Table 1, the anti-reflection evaporated coating 12a has excellent properties as an optical component such as durability and the like in addition to improved optical charcteristics.

Figure 4:
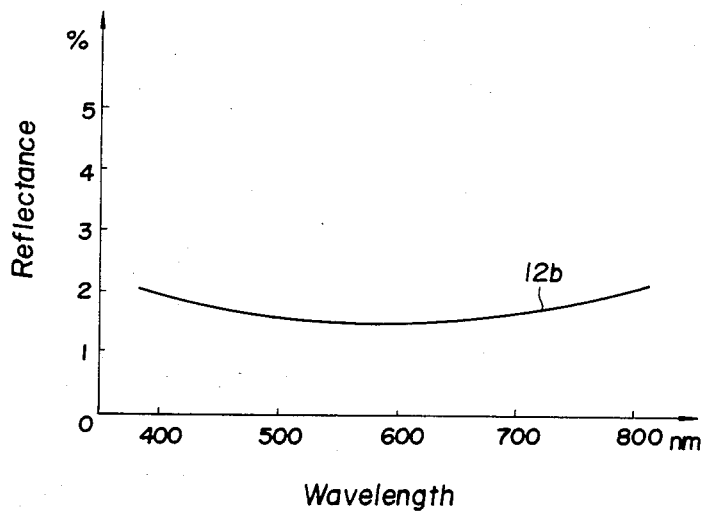

B: As the substrate 11, diethylene glycol bisallyl carbonate having a refractive index (α-ray) of 1.502 was used instead of BK-7, and the same procedure as described in the above item A was repeated to form an anti-reflection evaporated coating 12b having a refractive index of 1.389. This evaporated coating 12b showed an excellent spectral reflectance as shown in FIG. 4 and had improved properties for an optical component as shown in Table 1.

Figure 5:
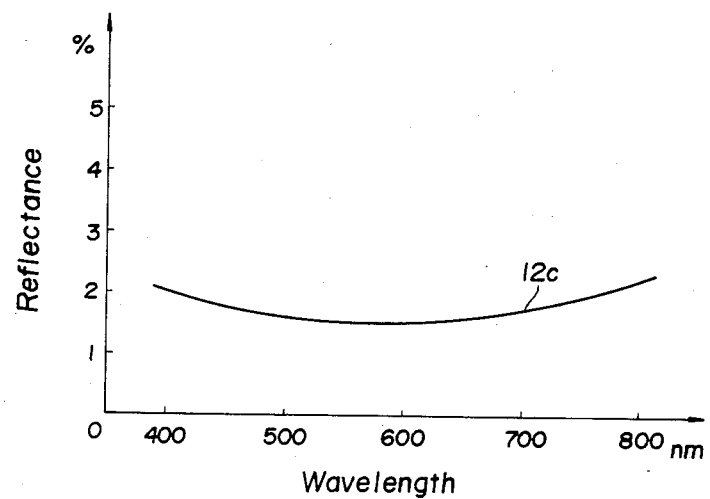

C: As the substrate 11, an injection molded product of acrylic resin having a refractive index (α-ray) of 1.499 was used instead of BK-7, and the same procedure as described in the item A was repeated to form an anti-reflection evaporated coating 12c having a refractive index of 1.389. This evaporated coating 12c showed an excellent spectral reflectance as shown in FIG. 5 and had improved properties for optical component as shown in Table 1.

EXAMPLE 2

Figure 6:
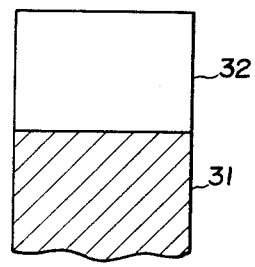
FIG. 6 is a schematically sectional view of another embodiment of the single layer anti-reflection coating formed on the substrate according to the invention.

As shown in FIG. 6, a hardenable anti-reflection coating 32 was formed on a substrate 31 for an optical component as follows.

Figure 7:
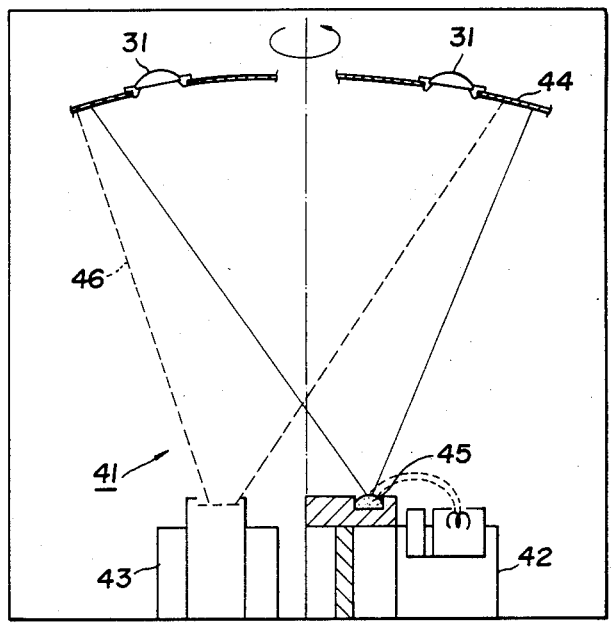
FIG. 7 is a diagrammatic view of another embodiment of the room temperature vacuum evaporation apparatus for practising the method of the invention.

A: BK-7 glass having a refractive index (α-ray) of 1.51633 was used as the substrate 11 and attached to a rotary dome 44 in a vacuum evaporation chamber 41 of a room temperature vacuum evaporation apparatus as shown in FIG. 7. On the other hand, a mixture obtained by adding 10–30% of $SiO_2$ to $MgF_2$ was used as evaporating material 45 and evaporated on the substrate 31 at room temperature by means of an electron gun 42. In this case, the ultimate vacuum degree inside the chamber 41 was $6\times10^{-6}$–$2\times10^{-5}$ Torr, and an Ar plasma ion beam 46 was irradiated from an Ar ion source 43 having a charged amount of $2$–$8\times10^{-5}$ Torr to the substrate 31.

Figure 8:
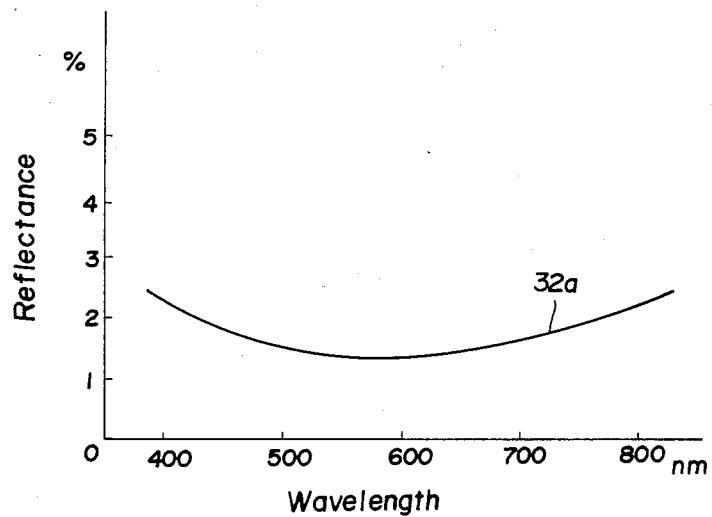
FIGS. 8 to 10 are characteristic curves of spectral reflectance of the single layer anti-reflection coating of FIG. 6 formed on various substrates, respectively.

The thus obtained anti-reflection evaporated coating 32a had a refractive index of 1.389 and an optical layer thickness of 137.5 mμ and showed an excellent spectral reflectance as shown in FIG. 8.

The properties of the evaporated coating 32a were measured by the same tests as described in Example 1 to obtain results as shown in Table 1. As apparent from the results of Table 1, the durability of the evaporated coating as an optical component is further improved by the irradiation of Ar plasma ion beam during the vacuum evaporation at room temperature.

Figure 9:
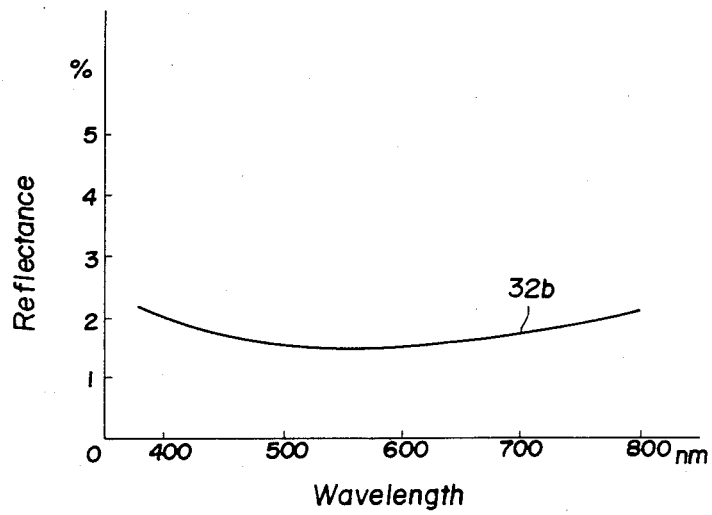

B: As the substrate 31, diethylene glycol bisallyl carbonate having a refractive index (α-ray) of 1,502 was used instead of BK-7, and the same procedure as described in the above item A was repeated to form an anti-reflection evaporated coating 32b having a refractive index of 1.289. This evaporated coating 32b showed an excellent spectral reflectance as shown in FIG. 9 and had improved properties for optical component as shown in Table 1.

Figure 10:
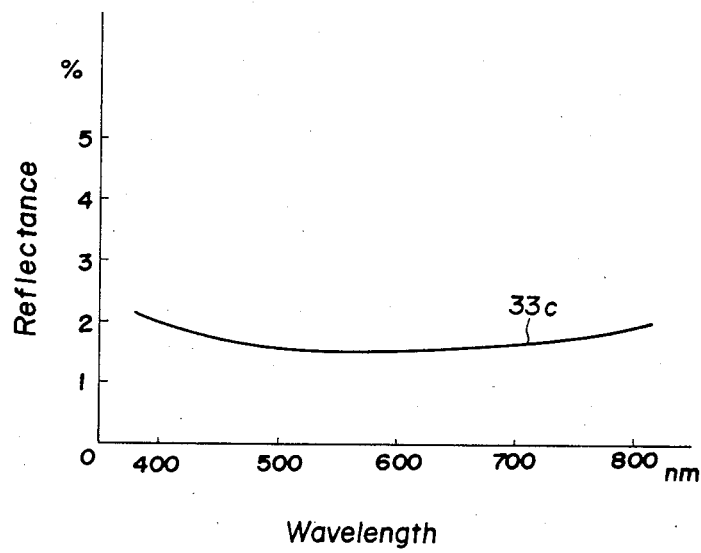

C: As the substrate 31, an injection molded product of acrylic resin having a refractive index (α-ray) of 1.499 was used instead of BK-7, and the same procedure as described in the item A was repeated to form an anti-reflection evaporated coating 32c having a refractive index of 1.389. This evaporated coating 32c showed an excellent spectral reflectance as shown in FIG. 10 and had improved properties for an optical component as shown in Table 1.

EXAMPLE 3

Figure 11:
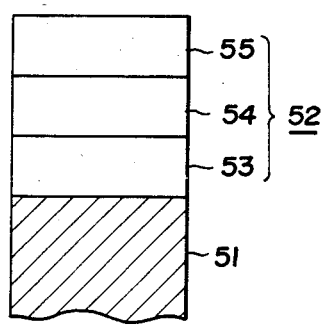
FIG. 11 is a schematically sectional view of an embodiment of the three layer anti-reflection coating formed on the substrate according to the invention.

As shown in FIG. 11, a three layer coating consisting of a first layer 53, a second layer 54 and a third layer 55 was formed as a hardenable anti-reflection coating 52 on a substrate 51 for optical component as follows.

A: BK-7 glass having a refractive index (α-ray) of 1.51633 was used as the substrate 51 and attached to the rotary dome 23 in the vacuum evaporation chamber 21 of the room temperature vacuum evaporation apparatus as shown in FIG. 2. On the other hand, a mixture obtained by adding 10–30% of $SiO_2$ to $CeF_3$ was used as the evaporating material 24 and evaporated on the substrate 51 at room temperature by means of the electron gun 22 to form a coating of the first layer 53 having a refractive index (α-ray) of 1.625 and an optical layer thickness of 125 mµ. Then, a mixture obtained by adding 10–30% of $SiO_2$ to $CeO_2$ was used as the evaporating material, and the same procedure as in the formation of the first layer 53 was repeated to form a coating of the second layer 54 having a refractive index of 2.02 and an optical layer thickness of 250 mµ on the first layer 53. Thereafter, a mixture obtained by adding 10–30% of $SiO_2$ to $MgF_2$ was used as the evaporating material, and the same procedure as in the formation of the first layer 53 was repeated to form a coating of the third layer 55 having a refractive index of 1.389 and an optical layer thickness of 125 mµ on the second layer 54. During the vacuum evaporation at room temperature for the formation of the first to third layers, the ultimate vacuum degree inside the chamber 21 was $6 \times 10^{-6} - 2 \times 10^{-5}$ Torr.

Figure 12:
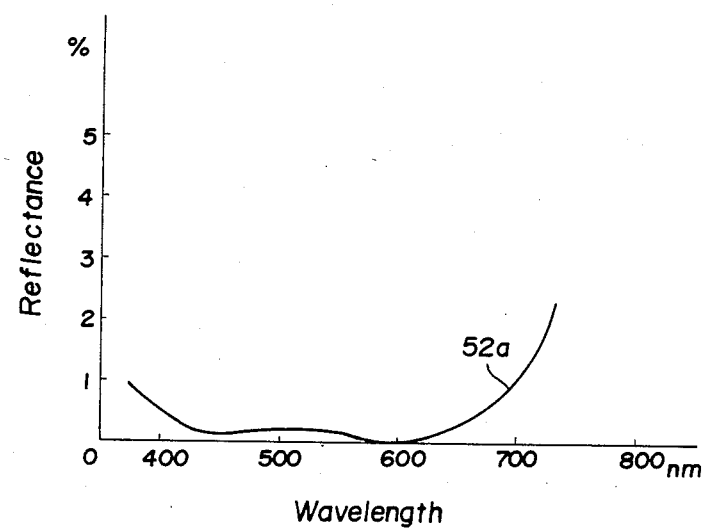
FIGS. 12 to 14 are characteristic curves of spectral reflectance of the three layer anti-reflection coating of FIG. 11 formed on various substrates, respectively.

The thus obtained anti-reflection evaporated coating 52a consisting of the first to third layers showed an excellent spectral reflectance as shown in FIG. 12 and had improved properties for optical component as apparent from the results of Table 1 obtained by the same tests as described in Example 1.

Figure 13:
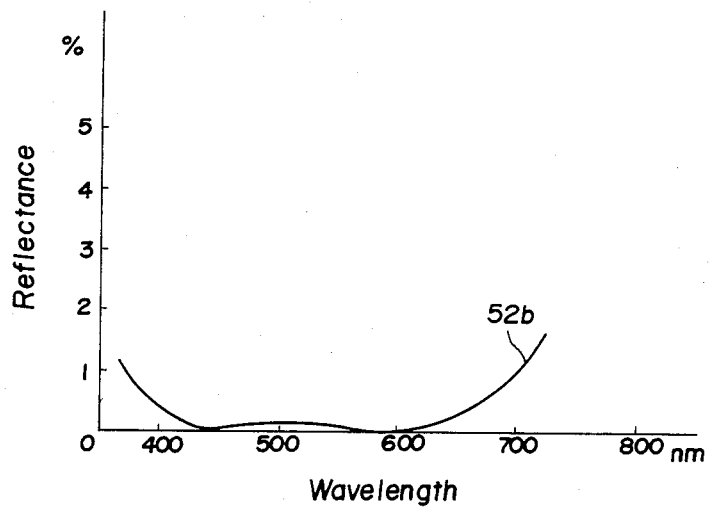

B: As the substrate 51, diethylene glycol bisallyl carbonate having a refractive index of 1.502 was used instead of BK-7, and the same procedure as described in the above item A was repeated to form an anti-reflection evaporated coating 52b consisting of the first to third layers. This evaporated coating 52b showed an excellent spectral reflectance as shown in FIG. 13 and had improved properties for an optical component as shown in Table 1.

Figure 14:
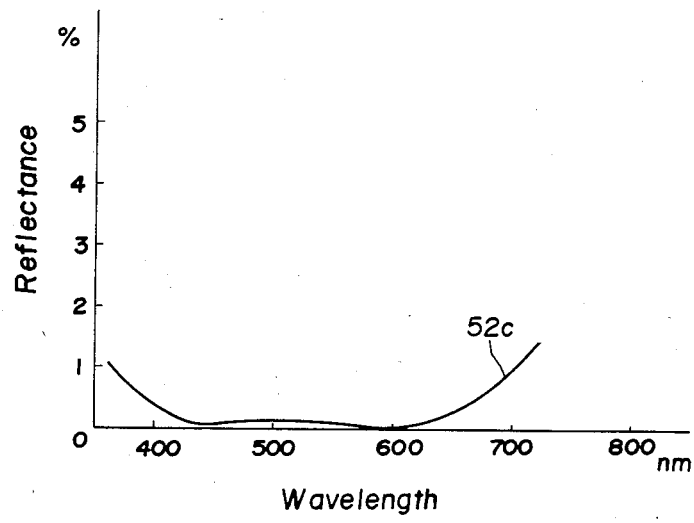

C: As the substrate 51, an injection molded product of acrylic resin having a refractive index of 1.499 was used instead of BK-7, and the same procedure as described in the item A was repeated to form an anti-reflection evaporated coating 52c consisting of the first to third layers. This evaporated coating 52c showed an excellent spectral reflectance as shown in FIG. 14 and had improved properties for optical component as shown in Table 1.

EXAMPLE 4

Figure 15:
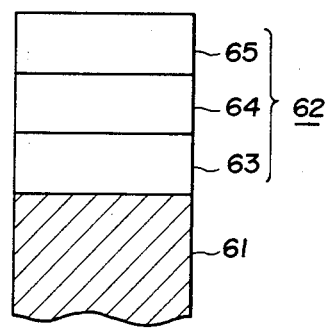
FIG. 15 is a schematically sectional view of another embodiment of the three layer anti-reflection coating formed on the substrate according to the invention.

As shown in FIG. 15, a three layer coating consisting of a first layer 63, a second layer 64 and a third layer 65 was formed as a hardenable anti-reflection coating 62 on a substrate 61 for optical component as follows.

A: BK-7 glass having a refractive index (α-ray) of 1.51633 was used as the substrate 61 and attached to the rotary dome 44 in the vacuum evaporation chamber 41 of the room temperature vacuum evaporation apparatus as shown in FIG. 7. On the other hand, a mixture obtained by adding 10–30% of $SiO_2$ to $CeF_3$ was used as the evaporating material 45 and evaporated on the substrate 61 at room temperature by means of the electron gun 42 to form a coating of the first layer 63 having a refractive index (α-ray) of 1,625 and an optical layer thickness of 125 mµ on the substrate 61. Then, a mixture obtained by adding 10–30% of $SiO_2$ to $CeO_2$ was used as the evaporating material, and the same procedure as in the formation of the first layer 63 was repeated to from a coating of the second layer 64 having a refractive index of 2.02 and an optical layer thickness of 250 mµ on the first layer 63. Thereafter, a mixture obtained by adding 10–30% of $SiO_2$ to $MgF_2$ was used as the evaporating material, and the same procedure as in the formation of the first layer 63 was repeated to form a coating of the third layer 65 having a refractive index of 1.389 and an optical layer thickness of 125 mµ on the second layer 63. During the vacuum evaporation at room temperature for the formation of the first to third layers, the ultimate vacuum degree inside the chamber 41 was $6 \times 10^{-6} - 2 \times 10^{-5}$ Torr, and the Ar plasma ion beam 46 was irradiated from the Ar ion source 43 having a charged amount of $2-8 \times 10^{-5}$ Torr to the substrate 61.

Figure 16:
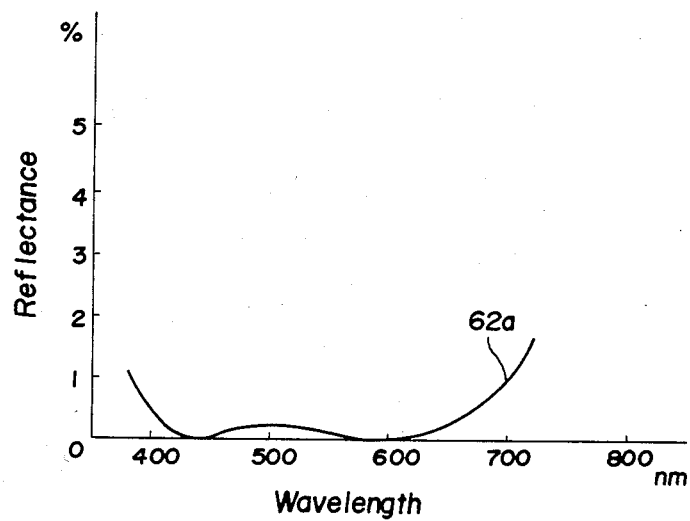
FIGS. 16 to 18 are characteristic curves of spectral reflectance of the three layer anti-reflection coating of FIG. 15 formed on various substrates, respectively.

The thus obtained anti-reflection evaporated coating 62a consisting of the first to third layers showed an excellent spectral reflectance as shown in FIG. 16. Further, the durability of the evaporated coating as an optical component was further improved by the irradiation of an Ar plasma ion beam during the vacuum evaporation at room temperature as apparent from the results of Table 1 obtained by the same tests as described in Example 1.

Figure 17:
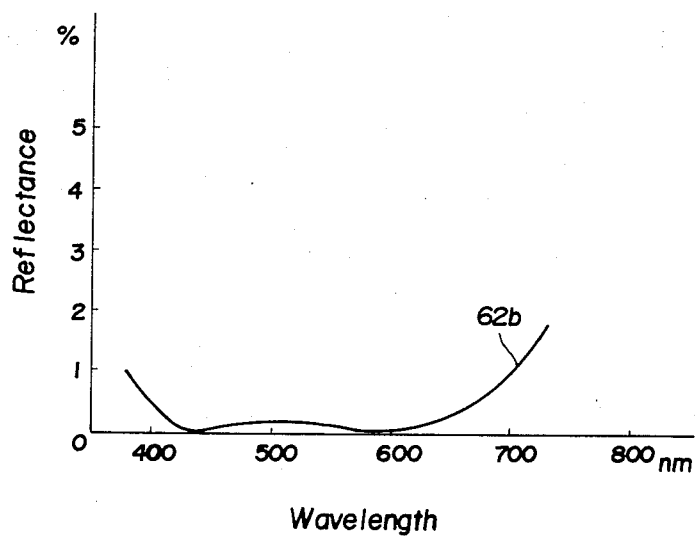

B: As the substrate 61, diethylane glycol bisallyl carbonate having a refractive index of 1,502 was used instead of BK-7, and the same procedure as described in the above item A was repeated to form an anti-reflection evaporated coating 62b consisting of the first to third layers. This evaporated coating 62b showed an excellent spectral reflectance as shown in FIG. 17 and had improved properties for an optical component as shown in Table 1.

Figure 18:
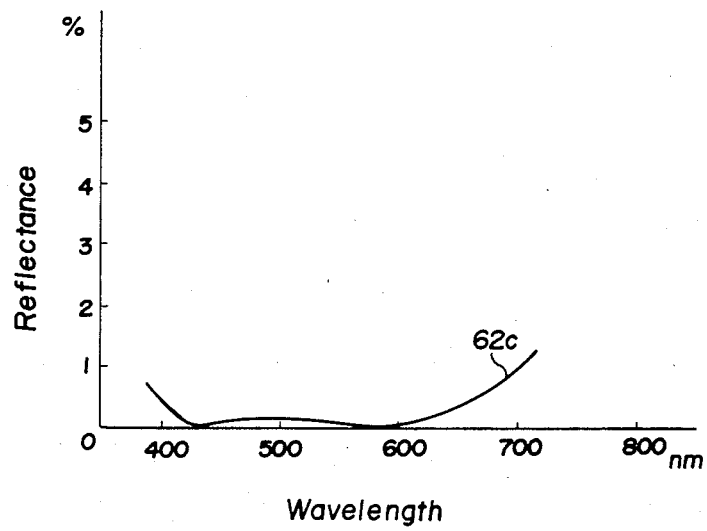

C: As the substrate 61, an injection molded product of acrylic resin having a refractive index of 1.499 was used instead of BK-7, and the same procedure as described in the item A was repeated to form an anti-reflection evaporated coating 62c consisting of the first to third layers. This evaporated coating 62c showed an excellent spectral reflectance as shown in FIG. 18 and had improved properties for an optical component as shown in Table 1.

Comparative Example 1

The same procedure as described in Example 1 was repeated by using A: BK-7 glass, B: diethylene glycol bisallyl carbonate and C: acrylic resin molded product as a substrate for optical component, except that a mixture obtained by adding 5% of $SiO_2$ to $MgF_2$ was used as the evaporating material. The thus obtained anti-reflection evaporated coatings (70a, 70b, 70c) had the same refractive index and optical layer thickness as in Example 1 and showed spectral reflectances substantially equal to those of FIGS. 3 to 5 as shown in FIGS.

19 to 21, respectively. However, the formation of a coating having no cracks is possible, but the adhesion, weather resistance and solvent resistance are poor as the properties for an optical component as apparent from the results of Table 1 obtained by the same tests as described in Example 1.

Comparative Example 2

The same procedure as described in Example 1 was repeated by using a mixture obtained by adding 40% of $SiO_2$ to $MgF_2$ as the evaporating material to form hardenable anti-reflection evaporated coatings (80a, 80b, 80c) having a refractive index of 1.406–1.411 on substrates of BK-7 glass, diethylene glycol bisallyl carbonate and acrylic resin injection molded product, respectively.

Figure 22:
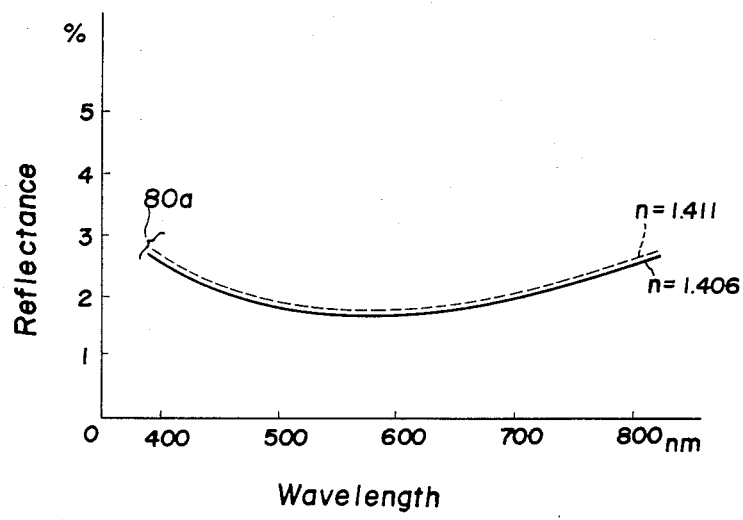
FIGS. 22 to 24 are characteristic curves of spectral reflectance of the single layer anti-reflection coating, which is made of $MgF_2$ and 40% $SiO_2$, formed on various substrates, respectively.
Figure 23:
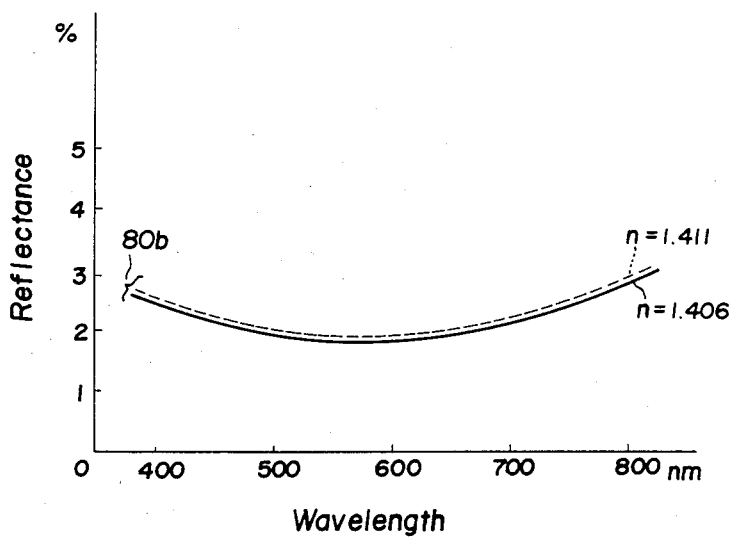
Figure 24:
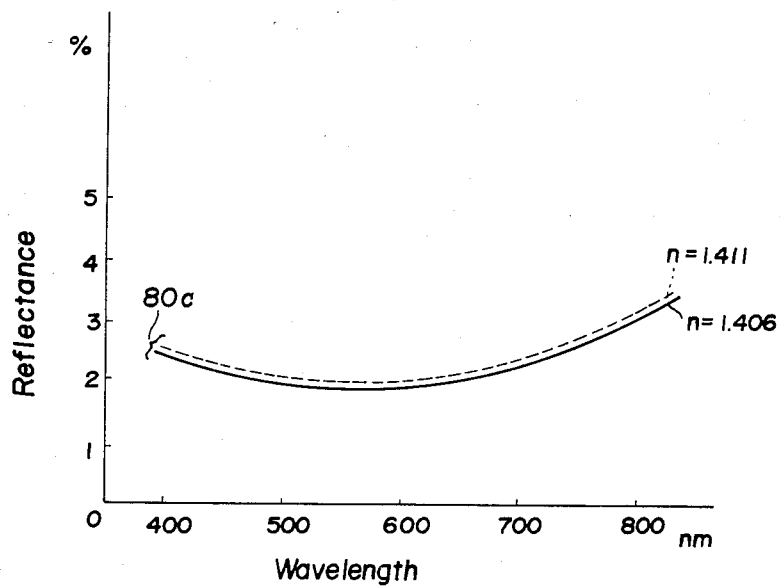

The thus obtained coatings have high spectral reflectance of about 0.4% and show a scattering in the reproducibility of spectral reflectance as shown in FIGS. 22 to 24 because $SiO_2$ is added in an amount as large as 40% as compared with the case of Example 1.

In the electron beam evaporation, when the intensity of electron ray or evaporation rate is large, cracks are apt to occur in the evaporated coating during the taking out of the coating from the chamber into atmosphere. Further, the coating is apt to cause tape-peeling even in the adhesion test.

Particularly, there is a serious problem that heat conductivity rapidly lowers to make the evaporation rate unstable and consequently large particles of the evaporating material are adhered to the substrate to make the appearance of the coating unacceptable because $SiO_2$ in the evaporating material is as large as 40%. That is, it is difficult to control the conditions for the formation of the coating before the measurement of the properties of the evaporated coating obtained from the evaporating material containing 40% of $SiO_2$. Further, the resulting evaporated coating is apt to become unacceptable in the examination of appearance and is insufficient in the properties needed for an optical component.

Comparative Example 3

The same procedure as described in Example 1 was repeated by using only $MgF_2$ instead of an $MgF_2$-$SiO_2$ mixture as the evaporating material to form anti-reflection evaporated coatings on the substrates of BK-7 glass, diethylene glycol bisallyl carbonate and acrylic resin injection molded product, respectively.

Figure 19:
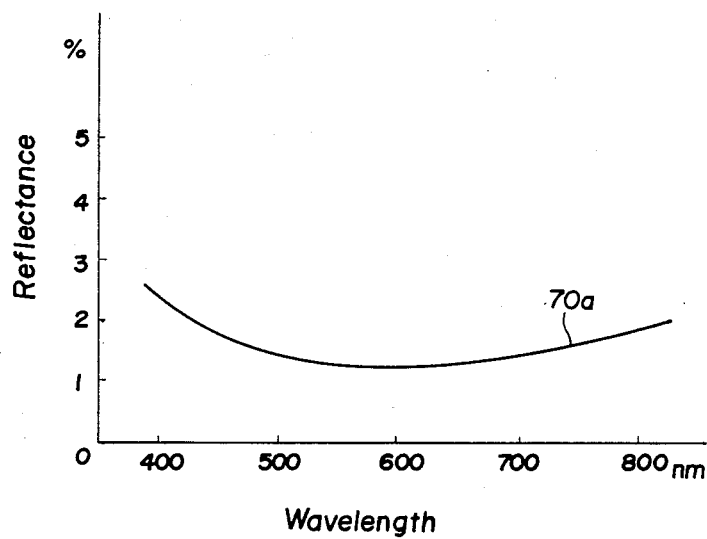
FIGS. 19 to 21 are characteristic curves of spectral reflectance of the single layer anti-reflection coating, which is made of $MgF_2$ and 5% $SiO_2$, formed on various substrates, respectively.
Figure 20:
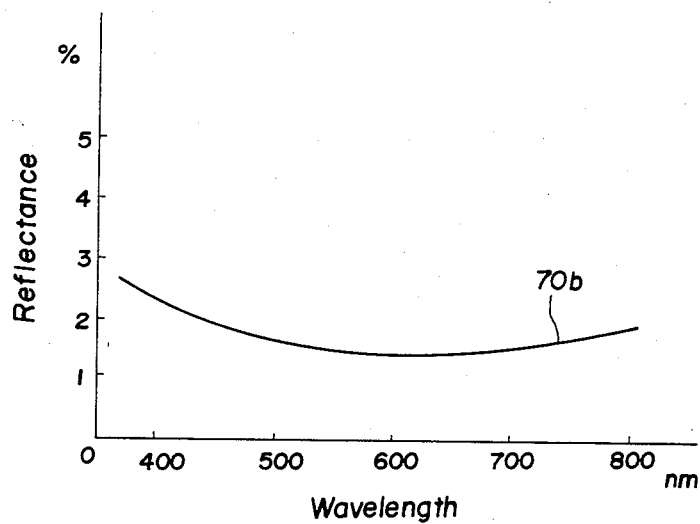
Figure 21:
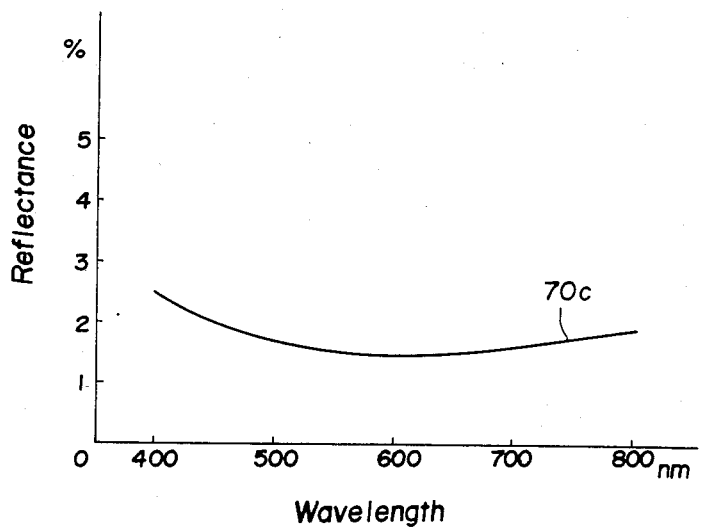

The thus obtained coatings have substantially the same spectral reflectances as shown in FIGS. 19 to 21 and are very poor in the properties needed for an optical component as shown in Table 1.

Comparative Example 4

The same procedure as described in Example 3 was repeated to form hardenable anti-reflection evaporated coatings of three layer structure (100a, 100b, 100c) on the substrates of BK-7 glass, diethylene glycol bisallyl carbonate and an acrylic acid injection molded product, respectively, except that only $CeF_3$ was used as the evaporating material for the first layer, only $CeO_2$ was used as the evaporating material for the second layer, only $MgF_2$ was used as the evaporating material for the third layer, and no $SiO_2$ was added to each of these evaporating materials.

Figure 25:
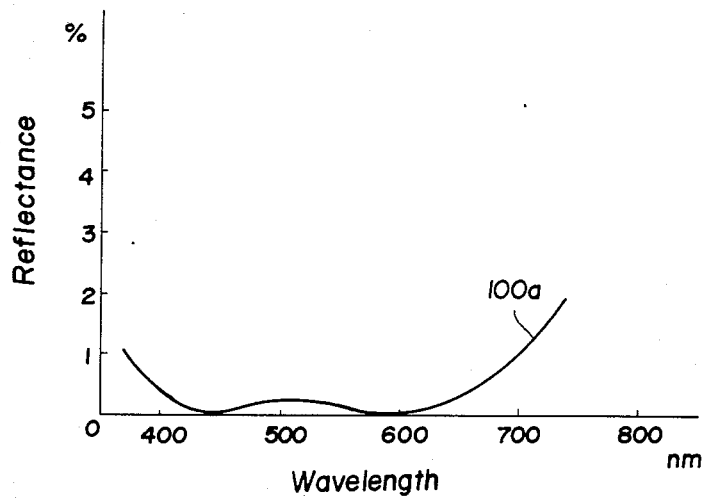
FIGS. 25 to 27 are characteristic curves of spectral reflectance of the three layer anti-reflection coating, which is made of $CeF_3$—$CeO_2$—$MgF_2$, formed on various substrates, respectively.
Figure 26:
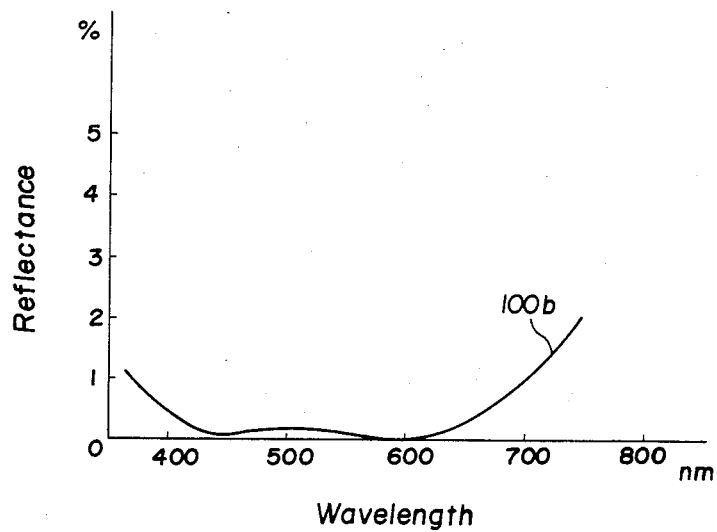
Figure 27:
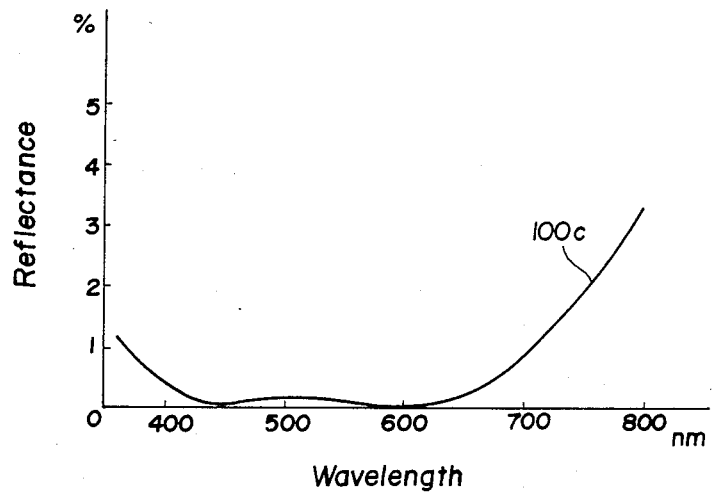

The thus obtained coatings (100a, 100b, 100c) showed spectral reflectances as shown in FIGS. 25 to 27 and had very poor properties for optical component as shown in Table 1.

TABLE 1

| | Anti-reflection coating | Substrate | Layer thickness | Change after coating formation (crack) | Scuffing resistance Cleaning cloth, lapping 20 times | Pencil hardness | Weather resistance Heat shock Humidity resistance (3 cycles) (crack) | Solvent resistance (ethanol) | Adhesion (tape) |
|---|---|---|---|---|---|---|---|---|---|
| Example 1 | | | | | | | | | |
| A | Vacuum evaporation at room temperature [$MgF_2$ + $SiO_2$ (10–30%)] | Glass (BK-7) | nd = λ/4 | o | A | 5H | o | o | o |
| B | | Diethylene glycol bisallyl carbonate | | o | B | 4H | o | o | o |
| C | | Acrylic resin (injection molding) | | o | B | 4H | o | o | o |
| Example 2 | | | | | | | | | |
| A | Vacuum evaporation at room temperature [$MgF_2$ + $SiO_2$ (10–30%)] + Simultaneous ion irradiation [ion beam gas: Ar (50%) + $O_2$ (50%)] | Glass (BK-7) | nd = λ/4 | o | S | 6H | o | o | o |
| B | | Diethylene glycol bisallyl carbonate | | o | B-A | 4H-5H | o | o | o |
| C | | Acrylic resin (injection molding) | | o | B-A | 4H-5H | o | o | o |
| Example 3 | | | | | | | | | |
| A | Vacuum evaporation at room temperature | Glass (BK-7) | | o | A | 5H | o | o | o |
| B | [$CeF_3$ + $SiO_2$ (10–30%)] + [$CeO_2$ + $SiO_2$ (10–30%)] + | Diethylene glycol bisallyl carbonate | three layer structure | o | B | 4H | o | o | o |
| C | [$MgF_2$ + $SiO_2$ (10–30%)] | Acrylic resin (injection molding) | | o | B | 4H | o | o | o |
| Ex- | | | | | | | | | |

TABLE 1-continued

| | Anti-reflection coating | Substrate | Layer thickness | Change after coating formation (crack) | Scuffing resistance Cleaning cloth, lapping 20 times | Pencil hardness | Weather resistance Heat shock Humidity resistance (3 cycles) (crack) | Solvent resistance (ethanol) | Adhesion (tape) |
|---|---|---|---|---|---|---|---|---|---|
| ample 4 | | | | | | | | | |
| A | Vacuum evaporation at room temperature | Glass (BK-7) | | o | S | 6H | o | o | o |
| B | [CeF$_3$ + SiO$_2$ (10-30%)] + [CeO$_2$ + SiO$_2$ (10-30%)] + [MgF$_2$ + SiO$_2$ (10-30%)] + | Diethylene glycol bisallyl carbonate | three layer structure | o | B-A | 4H-5H | o | o | o |
| C | Simultaneous ion irradiation [ion beam gas: Ar (50%) + O$_2$ (50%)] | Acrylic resin (injection molding) | | o | B-A | 4H-5H | o | o | o |
| Comparative Example 1 | | | | | | | | | |
| A | Vacuum evaporation at room temperature | Glass (BK-7) | | o | C | 3H | x | Δ | Δ |
| B | [MgF$_2$ + SiO$_2$ (5%)] | Diethylene glycol bisallyl carbonate | nd = λ/4 | o | D | 2H | x | x | x |
| C | | Acrylic resin (injection molding) | | o | E | H | x | x | x |
| Comparative Example 2 | | | | | | | | | |
| A | Vacuum evaporation at room temperature | Glass (BK-7) | | | | | | | |
| B | [MgF$_2$ + SiO$_2$ (40%)] | Diethylene glycol bisallyl carbonate | nd = λ/4 | | | | | | |
| C | | Acrylic resin (injection molding) | | | | | | | |
| Comparative Example 3 | | | | | | | | | |
| A | Vacuum evaporation at room temperature | Glass (BK-7) | | o | F | HB | x | x | x |
| B | [MgF$_2$] | Diethylene glycol bisallyl carbonate | nd = λ/4 | o | F | HB | x | x | x |
| C | | Acrylic resin (injection molding) | | o | F | HB | x | x | x |
| Comparative Example 4 | | | | | | | | | |
| A | Vacuum evaporation at room temperature | Glass (BK-7) | | x | F | HB | x | x | x |
| B | [CeF$_3$ + CeO$_2$ + MgF$_2$] | Diethylene glycol bisallyl carbonate | three layer structure | x | F | HB | x | x | x |
| C | | Acrylic resin (injection molding) | | x | F | HB | x | x | x | o means no crack,
Δ means slight presence of a crack,
x means presence of a crack As mentioned above, according to the invention, the anti-reflection coating can be formed on the substrate for optical component by subjecting a mixture, which is obtained by adding 10-30% of SiO$_2$ to an evaporating material having anti-reflection characteristics, such as MgF$_2$, as at least one layer to vacuum evaporation at room temperature by electron beam heating and if necessary irradiation of Ar plasma ion beam, so that the invention has the following merits.

(I) An anti-reflection coating having a high adhesion can be formed on any substrate such as glass, thermosetting resin, injection molding resin and the like, which is usable as an optical component, by vacuum evaporation at room temperature. That is, no peeling of the coating occurs in the peeling test with an adhesive-backed tape after the formation of the coating.

(II) The hardness is high. That is, a coating having a high scuffing resistance can be formed by vacuum evaporation at room temperature. Silicon oxide (particularly, Si>O in atomic %) is the only an evaporating material giving a high durable coating by vacuum evaporation at room temperature as compared with other evaporating materials. By adding this oxide to fluoride or the like having a good adhesion in an amount of 10-30%, a coating having a high hardness (improved scuffing resistance) can be obtained by vacuum evaporation at room temperature. For instance, anti-reflection coatings having excellent optical characteristics and durability can be formed as a single layer by using a mixture of $MgF_2$ and 10–30% of $SiO_2$ through vacuum evaporation at room temperature, while anti-reflection coatings of multi-layer structure having excellent hardenability, adhesion and crack resistance can be formed by adding 10–30% of $SiO_2$ to each of fluoride, oxide and the like through vacuum evaporation at room temperature.

(III) A coating having high heat resistance (heat shock resistance over a range of from low temperature to high temperature) and humidity resistance can be formed by vacuum evaporation at room temperature.

When vacuum evaporation at room temperature is carried out by using only $MgF_2$, a coating having excellent adhesion and hardness is obtained, but is brittle and produces cracks by repetitive change from low temperature ($-40°$ C.) to high temperature ($+80°$ C.). When 10–30% of $SiO_2$ is added to $MgF_2$, the coating after vacuum evaporation at room temperature has high viscosity and excellent heat resistance and humidity resistance.

(IV) The solvent resistance is improved. That is, by adding 10–30% of $SiO_2$ having a good solvent resistance to fluoride, oxide or the like having a poor solvent resistance, the coating after the vacuum evaporation at room temperature has very excellent solvent resistance and produces no cracking against a solvent such as ethanol, methanol or the like nor peeling due to degradation.

(V) There is no reduction of optical characteristics. Even if $SiO_2$ (10–30%) is added to fluoride or oxide for use in the formation of single layer or multi-layer, the refractive index is not changed and the durability can be improved without changing the optical characteristics (spectral reflectance).

(VI) By adding 10–30% of $SiO_2$ to the evaporating material, a durability equal to that of the conventional hot coat method is obtained through vacuum evaporation at room temperature. Further, when an Ar ion beam is irradiated to the substrate during the vacuum evaporation at room temperature, the durability of the coating is greatly improved by the synergistic action of the ion-bonding effect.

What is claimed is:

1. An optical component comprising a substrate for said optical component and an anti-reflection coating, formed on said substrate by subjecting a mixture of 10 to 30% of $SiO_2$ and an evaporating material having an anti-reflection effect to vacuum evaporation at room temperature.

2. An optical component, comprising a substrate for said optical component and an anti-reflection coating which is formed on said substrate by successively subjecting a mixture of an evaporating material having an anti-reflection effect and 10 to 30% of $SiO_2$ as a first layer, and a mixture of a fluoride or an oxide and 10 to 30% $SiO_2$ as middle and last layers to vacuum evaporation at room temperature.

3. The optical component according to claim 1 or 2, wherein said substrate is a glass substrate or a synthetic resin substrate.

4. The optical component according to claim 3, wherein said synthetic resin substrate is made from diethylene glycol bisallyl carbonate, acrylic resin, polycarbonate, acrylonitrile-styrene copolymer or polystyrene.

5. The optical component according to claim 1, wherein said evaporating material is $MgF_2$.

6. The optical component according to claim 2, wherein said fluoride is selected from $CeF_3$, $NdF_3$, $PbF_3$, $Na_3AlF_6$, NaF, LiF and $MgF_2$, and said oxide is selected from $CeO_2$, $ZrO_2$, $Ti_2O_3$, TiO and $Al_2O_3$.

7. A method of forming an anti-reflection coating on a substrate for an optical component, which comprises mixing 10–30% of $SiO_2$ with an evaporating material having an anti-reflection effect, subjecting said substrate to sputtering irradiation with an ion beam of Ar and/or $O_2$, and at the same time subjecting the mixture of $SiO_2$ and evaporating material to vacuum evaporation at room temperature by electron beam heating without heating said substrate to thereby deposit at least one layer of said mixture on said substrate.

8. The method according to claim 7 wherein said substrate is a glass or a synthetic resin for an optical component.

9. The method according to claim 8, wherein said synthetic resin is selected from diethylene glycol bisallyl carbonate, acrylic resin, polycarbontate, acrylonitrile-styrene copolymer and polystyrene.

10. The method according to claim 7, wherein 10–30% of $SiO_2$ is mixed with a fluoride as the evaporating material when the anti-reflection coating is a single layer.

11. The method according to claim 10, wherein said fluoride is $MgF_2$.

12. The method according to claim 7, wherein when the anti-reflection coating is a multi-layer structure, a mixture of a fluoride or a silicon oxide and 10–30% of $SiO_2$ for a first layer, and a mixture of a fluoride or an oxide and 10–30% of $SiO_2$ for middle and last layers are used as the evaporating material.

13. The method according to claim 12, wherein said fluoride is selected from $CeF_3$, $NdF_3$, $LaF_3$, $Na_3AlF_6$, NaF, LiF and $MgF_2$, and said oxide is selected from $CeO_2$, $ZrO_2$, $Ti_2O_3$, TiO and $Al_2O_3$.

14. The optical component according to claim 1 wherein said evaporating material is selected from a member of the group consisting of $CeF_3$, $NdF_3$, $LaF_3$, $PbF_3$, $Na_3AlF_3$, NaF, LiF, $MgF_2$, $CeO_2$, $ZrO_2$, $Ti_2O_3$, TiO, and $Al_2O_3$.

* * * * *